United States Patent [19]

Suetake

[11] Patent Number: 5,336,927
[45] Date of Patent: Aug. 9, 1994

[54] LEAD FRAME HAVING ELECTRICALLY INSULATING TAPES ADHERED TO THE INNER LEADS

[75] Inventor: Kenji Suetake, Tokyo, Japan

[73] Assignee: NEC Corporation, Japan

[21] Appl. No.: 8,741

[22] Filed: Jan. 25, 1993

[30] Foreign Application Priority Data

Feb. 3, 1992 [JP] Japan .................................. 4-017402

[51] Int. Cl.$^5$ ..................... H01L 23/48; H01L 29/44; H01L 29/52; H01L 29/60
[52] U.S. Cl. .................................. 257/670; 257/666; 257/671
[58] Field of Search ............... 257/666, 670, 671, 734, 257/667, 669, 674, 735, 787, 788, 690, 692

[56] References Cited

U.S. PATENT DOCUMENTS

| | | | |
|---|---|---|---|
| 4,597,816 | 7/1986 | Barnhart | 257/671 |
| 4,794,446 | 12/1988 | Hamano | 257/788 |
| 5,051,813 | 9/1991 | Schneider et al. | 257/666 |
| 5,176,366 | 1/1993 | Masumoto et al. | 257/671 |

*Primary Examiner*—Sara W. Crane
*Assistant Examiner*—Carl Whitehead, Jr.
*Attorney, Agent, or Firm*—Laff, Whitesel, Conte & Saret

[57] ABSTRACT

A semiconductor device includes an element mounting portion, suspending leads, a large number of inner leads, a semiconductor element, and insulating tapes. The element mounting portion is arranged at a central portion of a lead frame. The suspending leads support four corners of the element mounding portion from a peripheral portion of the lead frame. The large number of inner leads are formed toward the element mounting portion. The semiconductor element is mounted on the element mounting portion and has electrode portions connected to distal ends of the inner leads. Each of the insulating tapes has cut portions obtained by partially cutting two corners of both ends of a rectangle of each of the tapes near the element mounting portion and projection portions projected from two corners of the rectangle far from the element mounting portion and each having the same shape of each of the cut portions. The insulating tapes are adhered to the inner leads parallelly to four sides of the semiconductor element. Each insulating tape has the both ends extending on the suspending leads to fix the inner leads.

7 Claims, 7 Drawing Sheets

LEAD FRAME HAVING ELECTRICALLY INSULATING TAPES ADHERED TO THE INNER LEADS

BACKGROUND OF THE INVENTION

The present invention relates to a semiconductor device having a lead frame and, more particularly, to a semiconductor device having, as a characteristic feature, the shape of a nonconductive tape for bonding and fixing inner leads of a lead frame having the inner leads on the surface of the nonconductive tape.

In the lead frame of a conventional semiconductor device of this type, the distal end portions of inner leads are fixed by tapes consisting of a nonconductive resin to prevent the deformation of the inner leads.

FIG. 5 shows a part of an area corresponding to the inside of a package of a lead frame of the conventional semiconductor device. In FIG. 5, a semiconductor element 5 is mounted on an island 4 formed at the central portion of the lead frame, and the island 4 is supported by suspending leads 3. The distal ends of inner leads 1 formed toward the island 4 are connected to the electrodes of the semiconductor element 5 with metal thin lines (not shown). When the number of electrodes is increased, the number of inner leads corresponding to the electrodes is increased, and the distal ends of the inner leads 1 are micropatterned accordingly. For this reason, the inner leads 1 are easily deformed. Conventionally, four nonconductive insulating tapes 2 may be adhered to the inner leads 1 arranged at the four sides of the lead frame to prevent the deformation of the inner leads. In this case, each of the tapes has the shape of a rectangle, or as shown in FIG. 6C, corners of each of the rectangular tapes may partially cut to obtain tapes 2 each having C-shaped cut portions 2a.

Of the tapes of the above two types, the former, i.e., the rectangular tape, is used, when the tape is adhered to overlap the adjacent inner leads, the inner leads 1 are brought close to the suspending leads 3 due to the thermal shrinkage of the tape, short-circuiting disadvantageously occurs. For this reason, as shown in FIG. 6C, the tape is partially C-shaped cut to obtain the shape for preventing the short circuit.

Since each of the above conventional insulating tapes 2 has the shape shown in FIG. 6C, when the tapes 2 are cut out of a connected sheet-like tape base material 9 shown in FIG. 6A along cut lines 10 during the manufacture of the tapes, triangular pieces 2b must be cut off at C-shaped cut portions 2a.

The cut-off triangular tape pieces 2b, as shown in FIGS. 6A to 6C, are not easily and accurately discharged into a taping apparatus for cutting tapes, the tape pieces 2b are scattered near a lead frame apparatus, thereby disadvantageously decreasing the yield of semiconductor devices.

In order to prevent the above disadvantage, as shown in FIG. 7, tapes are punched out of a wide tape base material 19 along cut lines 11, a sheet-like remaining portion 2c from which the tapes are removed is left. In this case, however, the cost of materials for the tapes is increased by an increase in width of the tape base material.

SUMMARY OF THE INVENTION

It is an object of the present invention to provide a semiconductor device whose yield is increased by preventing tape pieces from scattering.

It is another object of the present invention to provide a semiconductor device whose cost is decreased by reducing a tape material.

In order to achieve the above objects, according to the present invention, there is provided a semiconductor device comprising an element mounting portion arranged at a central portion of a lead frame, suspending leads for supporting four corners of the element mounding portion from a peripheral portion of the lead frame, a large number of inner leads formed toward the element mounting portion, a semiconductor element mounted on the element mounting portion and having electrode portions connected to distal ends of the inner leads, and insulating tapes, each having cut portions obtained by partially cutting two corners of both ends of a rectangle of each of the tapes near the element mounting portion and projection portions projected from two corners of the rectangle far from the element mounting portion and each having the same shape as each of the cut portions, the insulating tapes being adhered to the inner leads parallelly to four sides of the semiconductor element, and each insulating tape having the both ends extending on the suspending leads to fix the inner leads.

DESCRIPTION OF THE PREFERRED EMBODIMENTS

The present invention will be described below with reference to the accompanying drawings.

Figure 1:
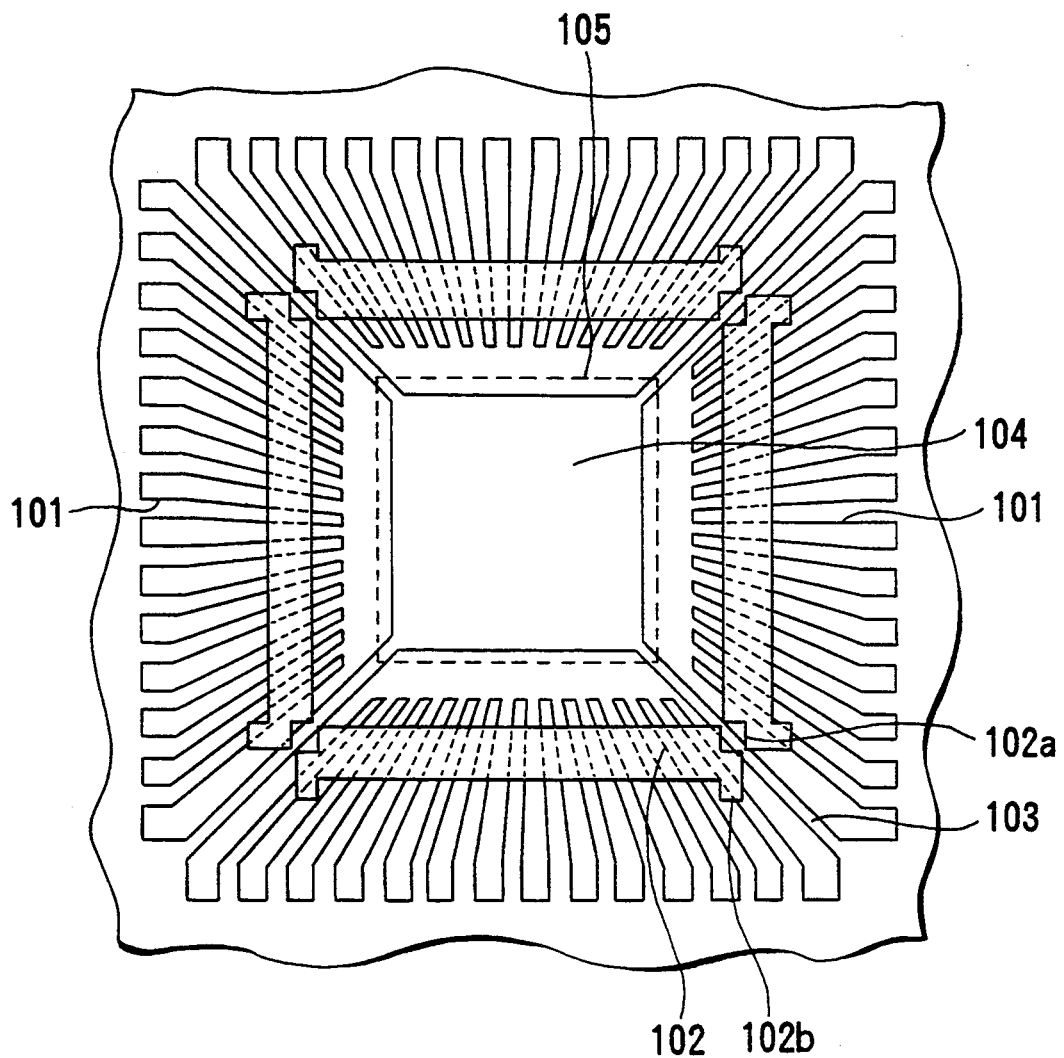
FIG. 1 is a plan view showing the main part of the inside of a semiconductor device according to the first embodiment of the present invention.

FIG. 1 shows the main part of a lead frame in a semiconductor device according to the first embodiment of the present invention.

In FIG. 1, a square island 104 having four corners supported by suspending leads 103 extending from the peripheral portion of a lead frame is arranged at the central portion of the lead frame, and a semiconductor element 105 is mounted on the island 104. A large number of inner leads 101 are formed from the peripheral portion of the lead frame toward the four sides of the island 104, metal lines (not shown) connect the distal ends of the inner leads to the electrode portions of the semiconductor element 105 mounted on the island 104. Four insulating tapes 102 having the same shape and the same length are adhered from the central portions toward the distal ends on the inner leads 101 connected to the semiconductor element 105 to be parallel to the four sides of the lead frame such that the tapes 102 surround the semiconductor element 105. Both the end portions of each of the insulating tapes 102 extend on the suspending leads 103 on both the sides of the plurality of inner leads 101 constituting one side of the lead frame to fix the inner leads 101.

Figure 2A:
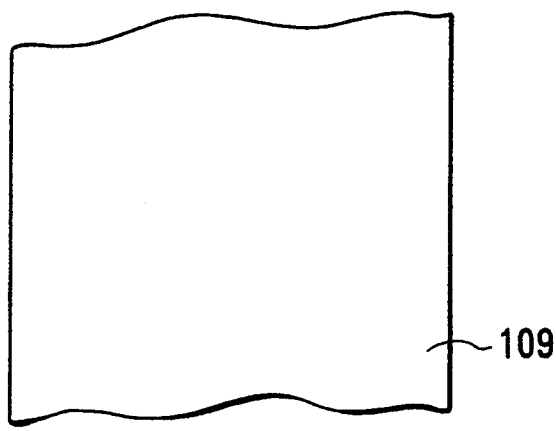
FIGS. 2A to 2C are plan views showing the steps in manufacturing insulating tapes in FIG. 1.
Figure 2B:
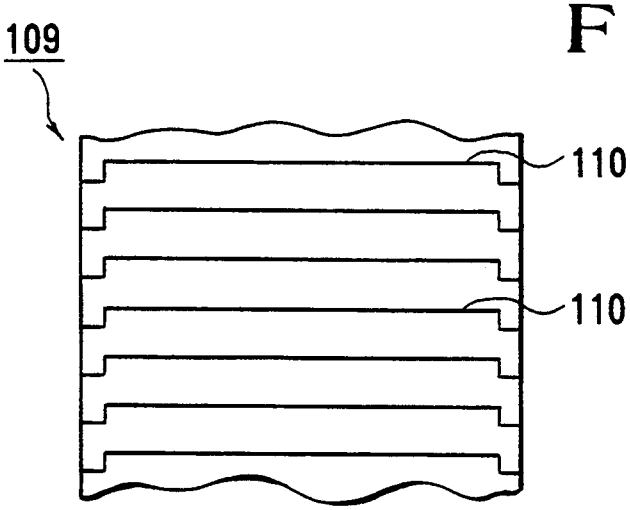
Figure 2C:
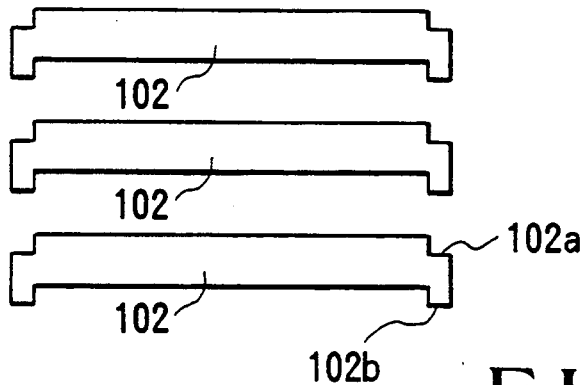

FIG. 2A shows a sheet-like tape base material 109 before the insulating tapes 102 are cut in the shapes of rectangles. The insulating tapes 102, as shown in FIG. 2B, are obtained by cutting the tape base material 106 in the direction of width of the tape base material 106 along cut lines 110 at predetermined intervals, and the tape base material 106 is divided into the tapes 102 each having the shape shown in FIG. 2C. Since each of the tapes 102 has cut portions 102a obtained by partially cutting the two corners of one cut line in the longitudinal direction of the tape in the shapes of squares and projection portions 102b each having the same shape of the cut portion 102a and formed at the two corners on the other cut line in the longitudinal direction of the tape, the tape base material 109 need not be punched out and can be used without any scrap, and no wasteful pieces are produced. For this reason, the pieces are not scattered in a taping apparatus. In addition, the insulating tapes 102 having the same shape and the same length can be easily formed.

The second embodiment of the present invention will be described below with reference to the accompanying drawings.

Figure 3:
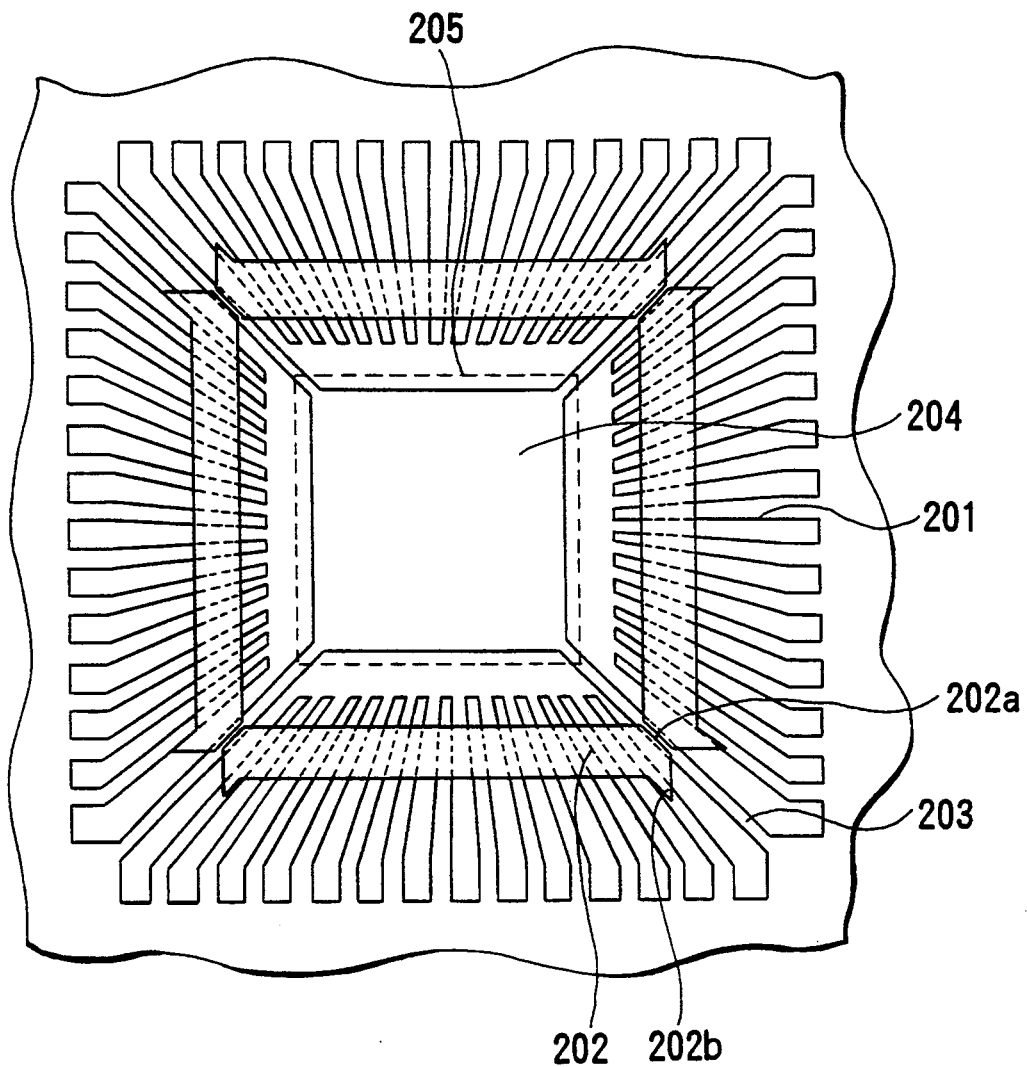
FIG. 3 is a plan view showing the main part of the inside of a semiconductor device according to the second embodiment of the present invention.

FIG. 3 shows the main part of a lead frame in a semiconductor device according to the second embodiment of the present invention.

Figure 4A:
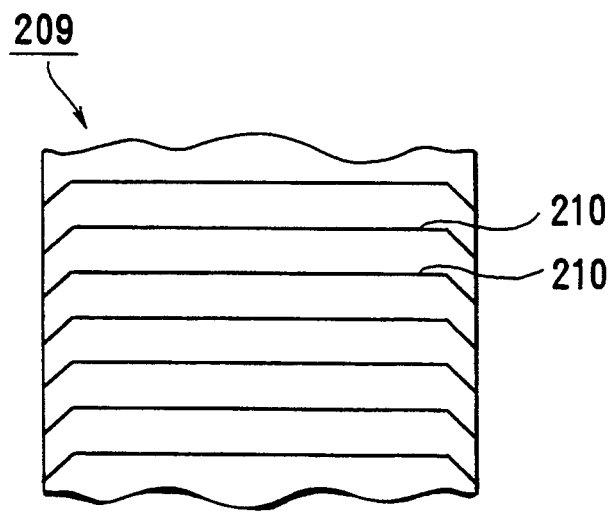
FIGS. 4A and 4B are plan views showing the steps in manufacturing insulating tapes in FIG. 3.
Figure 4B:
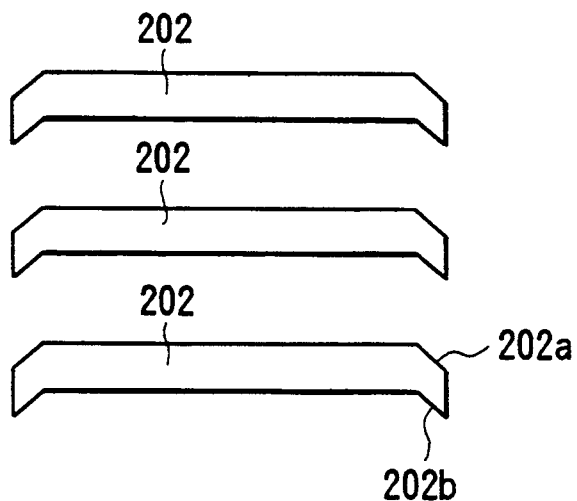
Figure 5:
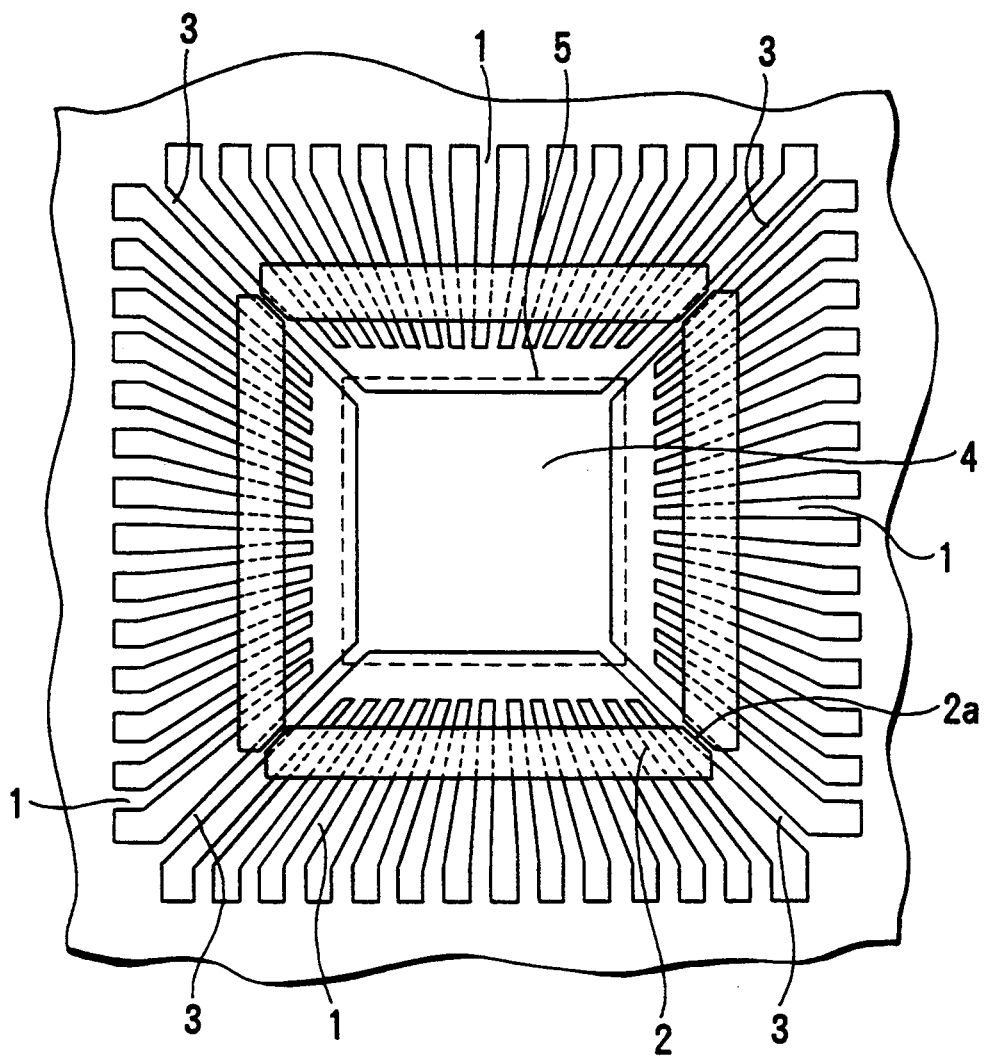
FIG. 5 is a plan view showing the main part of the inside of a conventional semiconductor device.
Figure 6A:
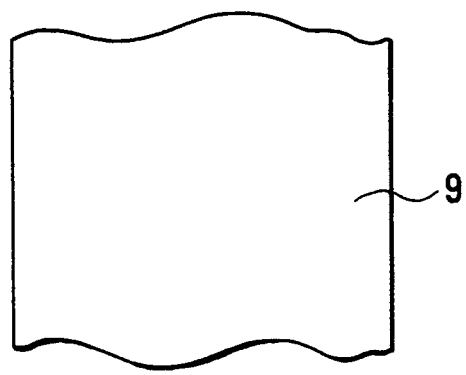
FIGS. 6A to 6C are plan views showing the steps in manufacturing insulating tapes in FIG. 5.
Figure 6B:
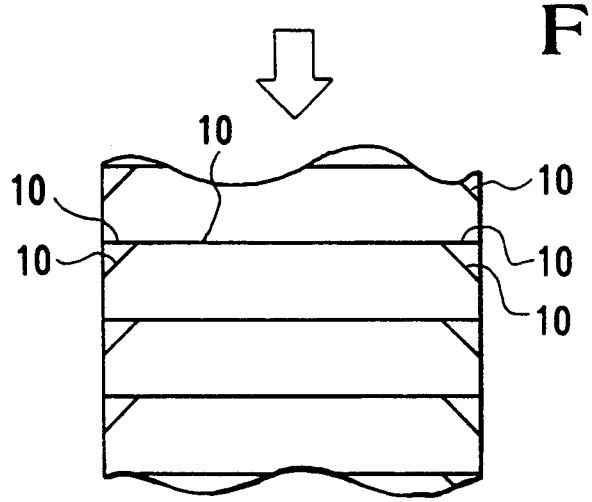
Figure 6C:
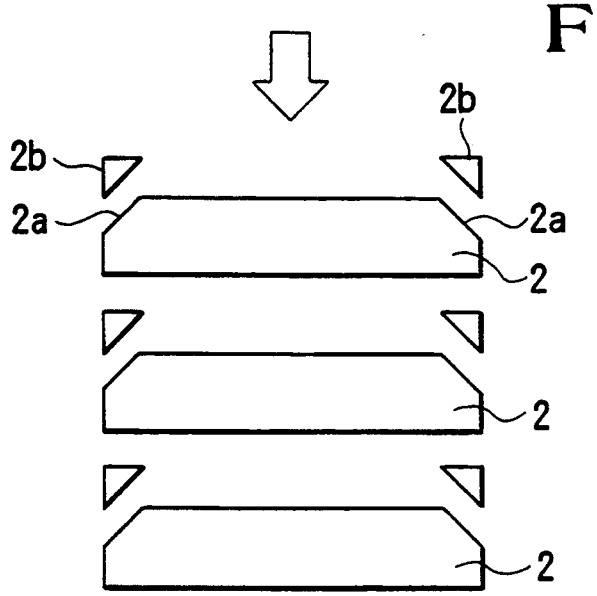
Figure 7:
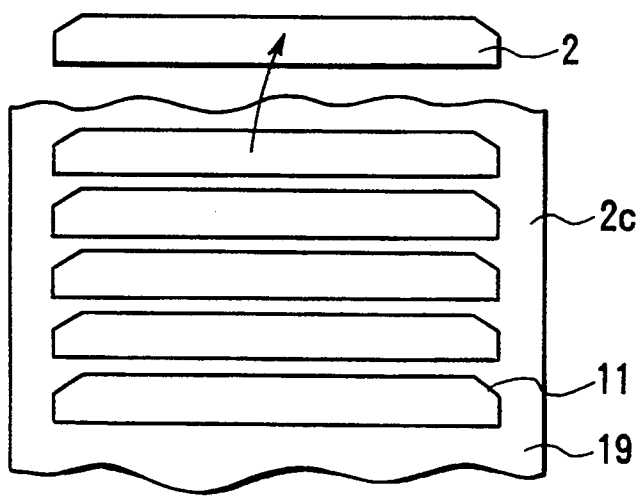
FIG. 7 is a plan view showing a sheet-like tape base material during the manufacture of another conventional insulating tape.

FIG. 4A shows a sheet-like tape base material 209 in which cut lines 210 are drawn before insulating tapes 202 are formed in the shapes of rectangles. The insulating tapes 202 are cut in the direction of width of the tape base material 209 along the cut lines 210 at predetermined intervals. Each of the tapes 202, as shown in FIG. 4B, has triangular C-shaped cut portions 202a at the same positions as those of the first embodiment and projection portions 202b each having the same shape as that of the C-shaped cut portion 202a. In the second embodiment, as in the first embodiment, no extra tape material cost is required. In addition, since both the ends of the tape 202 are cut in a C shape, manufacturing defects such as peeling of tapes when the tapes are cut out are decreased, the yield of semiconductor devices is increased.

As described above, according to the present invention, two corners on one side of a rectangular insulating tape in the longitudinal direction of the tape are partially cut, and projection portions each having the same shape as that of each cut portion are formed on the other side of the tape. For this reason, the tape having the shape for preventing inner leads from being bent and the shape capable of being formed from a tape base material without any scrap can be adhered to a lead frame. Therefore, a semiconductor device can be advantageously manufactured at low cost and high reliability.

What is claimed is:

1. A lead frame for a semiconductor device comprising:
   an element mounting portion, arranged at a central portion of a lead frame, for mounting a semiconductor element thereon, said element mounting portion being formed in a generally square shape;
   suspending leads for supporting four corners of said element mounting portion from a peripheral portion of said lead frame;
   a large number of inner leads formed to extend from the peripheral portion of said lead frame toward four sides of said element mounting portion, said inner leads having distal ends for making connections to electrodes portions of the semiconductor elements; and
   insulating tapes formed in substantially rectangle shapes, each of said tapes having cut portions which are obtained by partially cutting two corners at both ends thereof, and on a side near said element mounting portion, said insulating tape having projection portions projecting from two corners and on a side far from said element mounting portion, said projecting portions being at the both ends thereof, said insulating tapes being adhered on said inner leads and in positions extending parallel to the four sides of said element mounting portions, and both ends of each of said insulating tapes respectively extending over two adjacent ones of said suspending leads in order to fixedly adhere said inner leads, corresponding to one side of said element mounting portion, together with the adjacent suspending leads.

2. A lead frame according to claim 1, wherein said cut portions and said projection portions are formed in the shapes of rectangles.

3. A lead frame according to claim 1, wherein said cut portions and said projection portions are formed in the shapes of triangles.

4. A lead frame according to claim 1, wherein said insulating tapes have the same shape and the same length, and said insulating tapes are adhered to surround said semiconductor element.

5. A lead frame according to claim 1, wherein each of said insulating tapes is formed by cutting a belt-like tape base material in a direction of width of said base material at predetermined intervals, and cut portions of an arbitrary one of said insulating tapes constitute projection portions of an insulating tape adjacent to said arbitrary insulating tape.

6. A lead frame according to claim 1, wherein said insulating tapes are adhered on said inner leads with said cut portions of the adjacent insulating tapes opposite each other on said suspending leads.

7. A lead frame according to claim 1, wherein said cut portions of said insulating tapes are cut on the basis of crossing angles of said suspending leads and said insulating tapes.

* * * * *